United States Patent [19]

Walline

[11] 4,190,470
[45] Feb. 26, 1980

[54] PRODUCTION OF EPITAXIAL LAYERS BY VAPOR DEPOSITION UTILIZING DYNAMICALLY ADJUSTED FLOW RATES AND GAS PHASE CONCENTRATIONS

[75] Inventor: Robert E. Walline, Bedford, Mass.

[73] Assignee: M/A COM, Inc., Burlington, Mass.

[21] Appl. No.: 958,207

[22] Filed: Nov. 6, 1978

[51] Int. Cl.$^2$ .................... H01L 21/205; H01L 21/66
[52] U.S. Cl. ........................ 148/175; 29/574;
    118/690; 156/605; 156/606; 156/611; 427/8
[58] Field of Search .................... 148/174, 175; 427/8,
    427/248 A, 85, 87; 156/605, 606, 610–612;
    29/574; 118/7, 9

[56] References Cited

U.S. PATENT DOCUMENTS

| | | | |
|---|---|---|---|
| 3,173,814 | 3/1965 | Law | 148/175 |
| 3,441,000 | 4/1969 | Burd et al. | 148/175 X |
| 3,617,371 | 11/1971 | Burmeister | 156/611 |
| 3,701,682 | 10/1972 | Gartman et al. | 148/175 X |
| 3,721,583 | 3/1973 | Blakeslee | 148/175 X |
| 3,904,449 | 9/1975 | DiLorenzo et al. | 148/175 |
| 3,924,024 | 12/1975 | Naber et al. | 427/95 |
| 3,930,908 | 1/1976 | Jolly | 148/175 |
| 4,066,481 | 1/1978 | Manasevit et al. | 427/87 X |
| 4,100,310 | 7/1978 | Ura et al. | 427/8 |

OTHER PUBLICATIONS

Fergusson et al., "Transport of GaAs . . . Vapor Phase . . . Reaction", J. Electrochem. Soc., vol. 111, No. 5, May 1964, pp. 585–592.
Ewing et al., "Influence of Vapor Composition . . . Gallium Arsenide . . . ", J. Electrochem. Soc., vol. 111, No. 11, Nov. 1964, pp. 1266–1269.
Burmeister et al., "Large Area Epitaxial Growth . . . Applications", Transactions of Metallurgical Soc. of AIME, vol. 245, Mar. 1969, pp. 587–592.
Stewart, C. E. E., "Stoichiometric Effects . . . Layers of GaAsP", J. Crystal Growth, vol. 8, 1971, pp. 259–268.
DiLorenzo, J. V., "Vapor Growth of Epitaxial GaAs . . . Layers", J. Crystal Growth, vol. 17, 1972, pp. 189–206.
Enstrom et al., "Influence of Gas-Phase . . . GaAs P-N Junctions", J. Electrochem. Soc., vol. 121, No. 11, Nov. 1974, pp. 1516–1523.
Shaw, D. W., "Kinetic Aspects in the Vapor . . . III-V Compounds", J. Crystal Growth, vol. 31, 1975, pp. 130–141.
Nakayama et al., "Submicron GaAs Epitaxial Layers . . . Arsine", J. Electrochem. Soc., vol. 123, No. 8, Aug. 1976, pp. 1227–1231.

*Primary Examiner*—L. Dewayne Rutledge
*Assistant Examiner*—W. G. Saba
*Attorney, Agent, or Firm*—Wolf, Greenfield & Sacks

[57] ABSTRACT

Epitaxial layers of single crystals of gallium arsenide and similar compounds are formed by vapor deposition. A carrier gas flow is passed through a liquid halide of a group VB material to obtain a first vapor having a halogen, carrier gas and group VB material. The carrier gas flow is monitored and adjusted to obtain a predetermined mass of halogen and second material in this raw vapor. A final reactor input vapor is obtained with constant concentration and constant flow going into a reactor by monitoring the total volume of carrier gas in the raw vapor as added per unit of time and adjusting the raw vapor by adding a volume of additional carrier gas to a predetermined value to form a final reactor input vapor. The reaction and deposition of the epitaxial layer is then carried out in a reactor. A system is used for obtaining constant flow within the reactor with addition of dopants at desired levels while maintaining a constant dilution to the input flow so as to maintain at a deposition substrate, a predetermined constant flow or concentration of amount of reactants to carrier and diluent gas used.

28 Claims, 3 Drawing Figures

PRODUCTION OF EPITAXIAL LAYERS BY VAPOR DEPOSITION UTILIZING DYNAMICALLY ADJUSTED FLOW RATES AND GAS PHASE CONCENTRATIONS

BACKGROUND OF THE INVENTION

The art of producing epitaxial layers of single crystal materials formed from compounds derived from elements of group IIIB of Hubbard's Chart of the Atoms, and elements selected from group VB thereof is well-known in the art. Such materials are customarily formed for various electrical applications including epitaxially filmed or layered semiconductors, diodes, amplifiers, transistors, solar cells, thermophotaic cells, micromodular circuits, rectifiers, thermoelectric generators, optical filters, watt meters and other semiconductor devices.

The films are often formed by well-known vapor deposition methods as for example described in U.S. Pat. No. 3,146,137 and in Solid State Electronics, Volume 8 (1965) pages 178-80 "The Preparation of High Purity Gallium Arsenide By Vapor Phrase Epitaxial Growth".

Gallium arsenide for example can be prepared as is known by bubbling hydrogen carrier gas through an arsenic trichloride bubbler with the resultant material passed into a quartz tube-type reactor over a gallium source at a first temperature and from there to a substrate on which is deposited gallium arsenide at a second temperature. Such vapor deposition is known in the art to produce epitaxial layers. Dopants in the form of gases can be passed into the reaction chamber so that various n and p layers of epitaxial growth can be obtained.

It has been difficult in prior art procedures to obtain epitaxial layer formation of a highly controlled nature with high production yields. Various changes in parameters and reaction conditions often affect yield production rates and commercial feasibility of producing certain devices.

Although it is known that a hydrogen carrier gas bubbled through the arsenic trichloride to form the reactor input gas should provide a constant concentration material for input in order to keep reaction conditions constant and obtain substantially constant rate of growth for the epitaxial layer, it has been difficult to do that. The prior art has attempted to bubble the hydrogen through arsenic trichloride at a constant temperature to obtain constant concentration output. However, as the liquid level of arsenic trichloride goes down in any reaction, the amount of cooling of the gases entering and leaving changes, making temperature control extremely difficult. Moreover, liquid cools as it evaporates and leaves the arsenic trichloride bubbler, again making temperature control difficult.

When dopants are added to the reaction area in order to obtain n or p doped epitaxial layers of growth, this can greatly affect the rate of growth of the epitaxial layers. If the concentration of the reactor vapor passed over the substrate substantially changes because of addition of a dopant, growth rate will also substantially change.

SUMMARY OF THE INVENTION

It is an important object of this invention to provide an improved method of forming epitaxial layers of compounds formed from group IIIB and group VB elements in a controlled manner.

Another object of this invention is to provide a method in accordance with the preceding object which helps to obtain more constant growth rates of epitaxial layers and maximizes yield.

A still further object of the present invention is to provide a method in accordance with the preceding objects which is suitable for use in large scale manufacture of a variety of different final products.

It is a still further object of this invention to provide a method for assuring constant flow and constant concentration of entering materials to a reaction area prior to reaction with a group IIIB source and deposition on a substrate, by monitoring and adjusting carrier gas added to the entering gas flow.

It is a still further object of this invention to provide a method for adding dopants to an epitaxial layer by vapor addition to a vapor flow while maintaining a constant flow in a reactor of reactants at a substrate on which epitaxial layers are grown.

According to the invention, an epitaxial layer of a compound comprising a first material selected from the group consisting of boron, aluminum, gallium, indium and mixtures thereof and a second material selected from the group consisting of phosphorus, arsenic, antimony and mixtures thereof is provided by passing a carrier gas flow through a liquid halide of the second material to obtain a first vapor containing a halogen, carrier gas and second material as a raw reactor input vapor while monitoring the carrier gas flow and adjusting it to obtain a predetermined mass of halogen and second material in the raw vapor. A final reactor input vapor is formed while maintaining a constant flow rate of the final vapor at a constant concentration of second material by monitoring the total volume of carrier gas in the raw vapor as added per unit of time and adjusting said raw vapor by adding a volume of additional carrier gas to form said final vapor. The final vapor is passed to a source of the first material in a reactor where a reaction takes place, passing the products of the reaction to a seed crystal and depositing the epitaxial layer on the seed crystal.

A constant flow is maintained in a reactor for producing epitaxial layers as above described where a flow of reactor input vapor carrying the second material and a halogen is passed to the reactor at a first reaction zone having a source of the first material and the resultant vapor then passed to a second zone carrying a seed crystal where the epitaxial layer of said compound is formed. A supplemental constant volume vapor flow of a third material is passed to the reactor preferably between the first and second zones and consists of a material selected from the group consisting essentially of a diluent gas, dopant and mixtures thereof and preferably a mixture of dopant and diluent gas. Preferably the diluent gas and dopant mixture is formed by mixing to a first concentration of diluent gas to dopant and then adding additional diluent gas in an amount sufficient to maintain a desired predetermined concentration of dopant and subsequently changing said last-mentioned concentration to obtain a variation in dopant concentration.

The present methods utilize conventional dynamic mass flow controllers and dynamic vaporizer controllers as known in the art. The mass flow controllers regulate gas flow and the vaporizer controllers control the mass of arsenic trichloride picked up by the carrier gas and entering the reactor. The methods provide constant arsenic trichloride concentration entering the reactor at constant flow and optimized reasonably constant reaction times at the source and deposition zones of the reactor. Dynamic doping gas dilution controls impurity doping without affecting flow in the reactor and therefore maintains substantially constant reaction times. Automatic control of all gases and vapors is easily carried out by this method using conventional equipment. Optimal reactor conditions are obtained by use of constant flow and constant concentration which make the reaction constant, thus permitting manual, automated or computer controlled procedures to be used. Since the parameters are maintained by the present system, there is less variation which thus allows high yields to be obtained even when automated control is used although the system can be run manually and advantages obtained.

BRIEF DESCRIPTION OF THE DRAWINGS

The above and other objects, features and advantages of the present invention will be better understood from a reading of the following specification in conjunction with the enclosed drawings in which.

DESCRIPTION OF PREFERRED EMBODIMENTS

The epitaxial films or layers formed in accordance with this invention comprise compounds formed from elements of group IIIB of the periodic system and elements selected from group VB. Including in this group of compounds are the phosphides, arsenides and antimonides of boron, aluminum, gallium, indium and mixtures thereof. Preferred compounds within this group include gallium arsenide, gallium phosphide, indium arsenide, indium phosphide, gallium aluminum arsenide. In addition to use of the above compounds by themselves, mixtures of these compounds are also contemplated as epitaxial films, e.g. aluminum phosphide, and indium antimonide mixed in varying proportions can produce suitable semiconductor compositions.

Other combinations and elements include ternary and quaternary compositions or mixed binary crystals as known in the art.

These epitaxial layers can be deposited on substrates which include the same materials as used in the epitaxial films. As known in the art, dimensions of seed crystals such as 1 millimeter thick and 10 millimeters wide and 15-20 millimeters long can be used although larger or smaller crystals are also useful as seed crystals.

Conventional doping agents can be used and include n or p dopants to form np or pn junctions as known in the art. Trace amounts of impurities of an element or compound of the element selected from group II of the Periodic System such as zinc, beryllium, magnesium, cadmium and mercury can be used in order to provide p-type conductivity and group IV materials including tin, silicon, germanium and group VI materials such as sulfur, selenium and tellurium can be used to produce n-type conductivity. Halides, hydrides, organometallics and others known in the art can be used. These impurities are carried over to the reactant materials through a reactor doping input into the vapor phase of the reactant materials and deposited in a uniform dispersion in the epitaxial layers formed as known in the art. The quantity of dopant material added corresponds to the level of carrier concentration desired in the epitaxial film or layer to be formed.

Vapor deposits of purified material having the same conductivity type as the substrate may be utilized to form intrinsic pp+ or nn+ regions. Variations in the amount and type of dopant added at different stages in a reaction in a conventional reactor of the type used in this invention, permit formation of plural layered devices of epitaxial layers having selected electrical conductivity type and resistivity which can be controlled by layer thickness and dopant concentration. Small regions of surface junctions or wide area films can be obtained.

Figure 1:
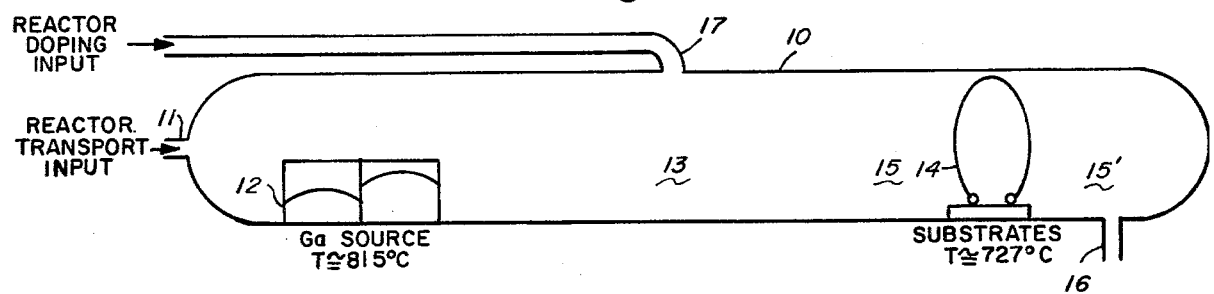
FIG. 1 is a semidiagrammatic view of a reactor used in a preferred embodiment of this invention.

With reference now to the drawings, a substantially conventional reactor 10 is illustrated in FIG. 1 which can be surrounded with a conventional Lindberg Hevi Duty hinged tube furnace having an inside diameter of 2½" by 24" length heated to reaction temperatures as known in the art in three zones of six inches, twelve inches and six inches in seriatim. The first zone of the reactor includes the reactor transport input opening 11 to receive a final reactor input vapor and pass it over a gallium source 12 in the first zone and from there to an intermediate area 13 with the reaction products then passing to a substrate 14 in a second zone 15. An outlet for the furnace is shown at 16 and a reactor doping input entrance is indicated at 17 to allow introduction of a dopant gas and/or an etching gas. There is a continuous temperature gradient from one end of the reactor to the other with an area beyond the substrate at a still lower temperature in a third zone 15'. The general method will be discussed with regard to gallium arsenide for convenience although it should be understood that any of the compounds noted above can be used so long as a transport agent in the form of a liquid halide is available.

In some cases more than one source material can be used as known in the art. Preferably the first zone of the furnace is maintained at a temperature suitable for gallium pickup and reaction, the second and third zones at a temperature suitable for transport of the reaction products and suitable to deposit an epitaxial layer.

Figure 2:
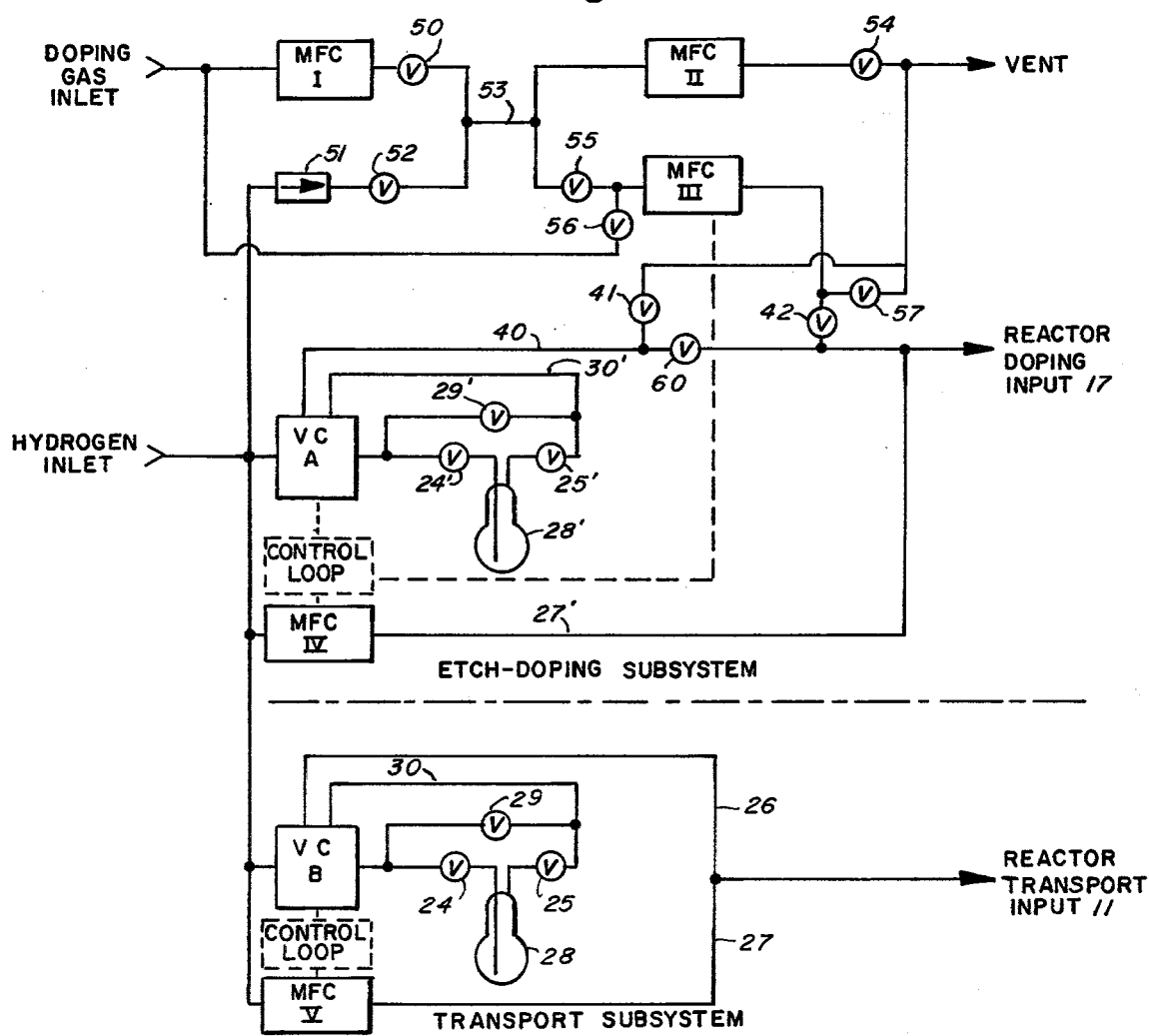
FIG. 2 is a system diagram showing gas flow paths and controls for the reactor of FIG. 1.

The inlet 11 receives the final reactor input vapor obtained by bubbling hydrogen arsenic trichloride as shown in the transport subsystem in FIG. 2. In this transport subsystem, a hydrogen carrier gas is obtained from a hydrogen inlet and passed to a vaporizer controller VCB which then passes hydrogen through valve 24 to a liquid flask 28 containing arsenic trichloride where the hydrogen is bubbled through and passed through valve 25 back to the vaporizer controller VCB for passage through a suitable line 26 to the reactor transport input. A mass flow controller MFC V places a predetermined amount of additional hydrogen through line 27 to form the final reactor input vapor from the transport subsystem. The hydrogen or other gas used is referred to herein as a carrier gas even though it may enter into a reaction with the liquid halide. A raw reactor input vapor is obtained from the vaporizer controller VCB. The vaporization controller electrically determines the added mass of the gas flow returning through line 30 from the bubbler 28 by electrically measuring an appropriate property of the gas such as thermal conductivity, thereby determining the mass of arsenic trichloride which has been picked up and automatically adjusts the input hydrogen flow through valve 24 to provide a constant mass of arsenic trichloride pickup in line 26. A control loop monitors a voltage output from VCB proportional to the hydrogen flow/unit time going in through valve 24 and the line leading to it, to obtain a first value of hydrogen flow per unit time. That control loop gives an electrical output signal proportional to the flow of hydrogen through the line leading to valve 24 and passes the output as a voltage to electrically operated mass flow controller MFC V which permits hydrogen carrier flow through line 27. The amount of hydrogen flow through line 27 and valve 24 is constantly monitored and controlled so that the total hydrogen flow through valve 24 and line 27 is always constant to give constant flow and constant concentration of arsenic in the reactor transport input 11. Preferably there is always some flow through line 27 when VCB is operating.

Vaporizer controllers can be Source V Vaporizer Controller 300 SCCM maximum carrier gas flow of hydrogen for an arsenic trichloride bubbler obtained from Tylan Corp. of Torrance, California.

The mass flow controllers used can be Model FC-260 Mass Flow Controllers 100 or 300 SCCM or 5 SLPM full scale flow rate for hydrogen gas obtained from Tylan Corp. of Torrance, California.

Any conventional mass flow controller or vaporizer controller can be used as known in the art.

The control loop of the transport subsystem controls the mass flow controller MFC V. The control loop picks up a voltage signal from VCB which changes with changing hydrogen flow in line 24. Conventional electrical systems as known in the art can be used for the control loop.

Figure 3:
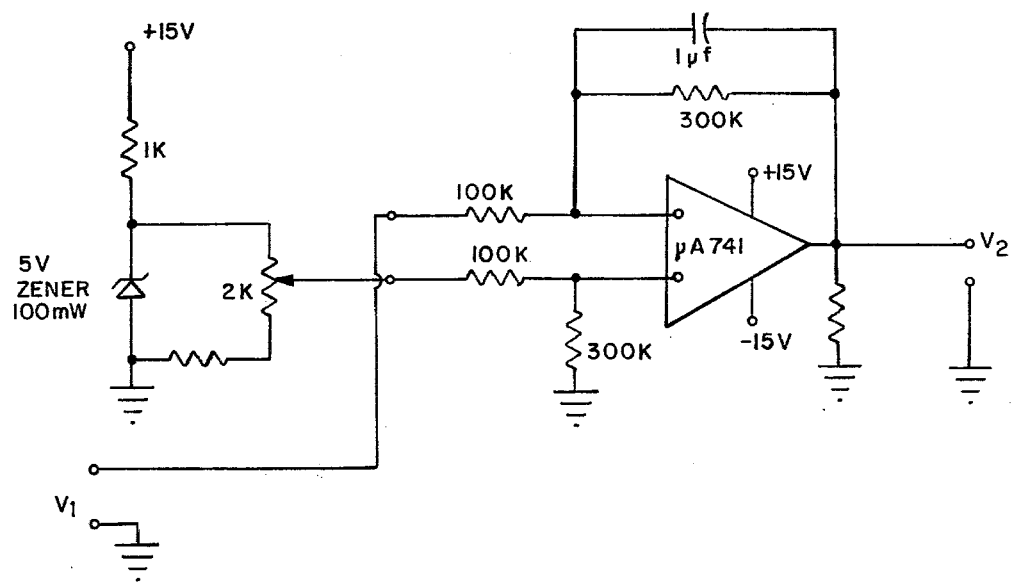
FIG. 3 is a circuit diagram of a sample control loop useful in operating a system as shown in FIG. 2.

The control loop determines in effect what voltage output will be needed to actuate a particular flow in MFCV to correspond with the voltage output of VCB to give a constant flow at 11. This is done by varying the hydrogen flow in line 27 through variations of the opening in the electrically operated valve of MFCV. Any system that takes in an electrical signal and gives out an electrical signal corresponding to a response to the input signal to balance flow can be used. FIG. 3 shows an example of a hard wired control loop used for the transport subsystem where the voltage $V_1$ shown is obtained from VCB and results in voltage $V_2$ directed to MFCV where the relationship is such that $V_2 = 3V_1 + 3(4.17)$. This allows a useful carrier gas flow range in VCB of 190 to 250 cc per minute with a useful mass flow control range of from 60 to 0 cc per minute resulting in a constant flow at 11 of 250 cubic centimeters per minute. The control loop for the etch doping subsystem can be identical but more often is designed for different voltage inputs and outputs depending upon the sizing of the mass flow control as used. In the etch doping subsystem the control loop obtains a voltage from either VCA and operates as above described or from MFC III where the voltage is indicative of flow through MFC III and in either case it adjusts flow in line 27' to obtain constant predetermined flow at 17. The control loop can be part of a software system in a computer control, if desired. When a computer is used one can measure voltage $V_1$, calculate voltage $V_2$ and apply voltage $V_2$ to the mass flow controller. The computer can have a software program that allows elimination of the control loops shown for each of the etch doping subsystem and transport subsystem.

It should be understood that the transport subsystem can be operated to provide flow through valve 29 of hydrogen when valves 24 and 25 are closed to permit purging of the system. In operation, valves 24 and 25 are opened and valve 29 closed to permit flow to the reactor transport input end of the reactor from the bubbler 28.

An etch-dopant subsystem as shown in FIG. 3 preferably comprises a vaporizer controller VCA, control loop and mass flow controller MFC IV with an arsenic trichloride bubbler and piping system as shown in the transport subsystem. Reference numerals corresponding to substantially identical identical parts are noted with prime numbers.

This system can be used simultaneously with the transport subsystem to provide a constant flow through the reactor at the input 17 and at the substrate. If there is to be no dopant, valve 29' is open, valves 24' and 25' closed and hydrogen flows directly into the input 17 in a constant flow so that there is constant flow in the reactor even though no dopant is being added. This mode is only used for purging. During a beginning stage of the reaction where it is customary to etch the surface of the seed crystal used as a substrate in order to provide for better epitaxial deposition, the bubbler 28' can be used in the same manner as described for use in the transport subsystem to provide a final reactor input vapor at 17 suitable for etching.

When the etching portion of the etch-dopant subsystem is used alone, valves 41 and 42 are closed and line 40 functions in the same manner as line 26.

The doping portion of the system is shown at the top part of the etch-doping subsystem and incorporates the control loop and MFC IV of the etch portion of the etch-doping subsystem in its operation.

The doping subsystem includes mass flow controller MFC I with valve 50 interconnected with a hydrogen flow through a check valve 51 and on-off valve 52 leading to a T connection 53 which branches to a mass flow controller MFC II through an on-off flow valve 54 to vent. A second branch provides flow through on-off valve 55 to a third mass flow controller MFC III having a doping gas supplementary valve 56 interconnected therewith and passing gas to valve 42 and thence to line 40 upon opening of valve 24 and closing valve 57. Valve 41 is normally closed and only used as a vent for the etch portion of the etch system. In normal practice when the doping subsystem is used the etch subsystem is inactivated by closing valve 60 and opening valve 41 thus utilizing only line 27' and MFC IV to obtain additional diluent gas flow and a constant flow condition. Valve 56 is normally closed and used when an abrupt change to a high level dopant concentration is desired.

The doping system uses intentional impurity doping with dopants preferably in gaseous form or carried by a diluent gas. When the dopants are in liquid form a system similar to the transport subsystem can be used to provide a constant concentration vapor input to MFC I.

Intentional impurity doping is used to improve the reproduceability and control of the gallium source reaction by maintaining a constant concentration of reacting species in the transport reaction, allowing the carrier gas flow of the transport vaporizer controller to be used as an indicator of normal bubble performance and helps to maintain the transport reaction products at constant concentrations in the epitaxial deposition zone of the reactor. Impurity densities at or below $1 \times 10^{15}/cm^3$ can be obtained. Impurity densities are normally in the range of $5 \times 10^{14}/cm^3$ to $5 \times 10^{19}/cm^3$.

In order to use doping gases to control carrier density dilute concentrations of doping gases in a carrier gas are required. At levels of $10^{15}$ carriers per $cm^3$ gas concentrations below 1 ppm are required. Dynamic dilutions are preferably used. This is obtained by the use of three mass flow controllers as shown in FIG. 2 in the doping array shown.

By the use of the dopant portion of the etch-doping subsystem a constant flow into the reactor dopant input is maintained. When no doping is required a constant flow of diluent gas is provided by line 27′ to the reactor doping input or through line 40 of the etching system. It is also possible for both the etching and dopant portions to operate simultaneously. The constant flow into the reactor doping input 17 assures a constant flow in the deposition zone of the reactor where epitaxial growth occurs which in turn helps provide (1) constant reaction time in the deposition zone even when doping changes are made, (2) constant concentration of transport reagents in the deposition zone independent of doping density, and (3) dopant concentration as a function only of the dopant dilution system.

The diluent gas for the dopant is preferably hydrogen although it can be any inert gas or mixture such as helium, argon, neon and the like. The diluent gas need not be the same gas as the carrier gas used.

The carrier gas which can be the same as the diluent gas is preferably hydrogen. Other carrier gases include helium or argon.

FIG. 2 shows MFC I interconnected with valve 50. MFC III controls the amount of diluted mixture from the on-off hydrogen valve 52 that goes into the doping input of the reactor. If the flow in MFC I and III are the same, then MFC II acts to control the amount of hydrogen diluent from valve 52. Thus, if there is a hundred SCCM flowing in MFC III and MFC I, then MFC II determines how much is flowing through valve 52 because as the amount of flow is lowered in MFC II the amount of hydrogen flow from valve 52 is lowered and as the amount of flow per minute in MFC II is raised the amount of hydrogen diluent flow per minute to mix with the doping gas coming through the inlet and through MFC I is raised. This type of arrangement is known in the art. If it were used alone, one could vary the dopant gas level but the flow going into the reactor doping input would also vary. It is desired to keep the gas flow constant in order not to affect reaction conditions no matter what the mass of doping gas. Since the dopant mass is so small, it does not affect reactor conditions in the reactor, but a change in flow would affect conditions, and thus affect the growth rate of the epitaxial layer, which effect would be undesirable. This is avoided by using the control loop from the etch-dopant system in the same way the control loop of the transport subsystem is used to measure flow through MFC III as a voltage. As flow through MFC III is varied, the control loop will automatically adjust MFC IV to provide for an equal and opposite variation in flow in line 27′. Thus, if the amount of gas flow through MFC III is lowered, that amount by which it is lowered is sensed and the amount of gas flow of hydrogen diluent through line 27′ is raised so that the reactor doping input sees a constant flow so as to never change the concentration of the feed stock in the reactor.

When the dopant gas inlet is used to provide a dopant, valve 50 is open, valve 52 is open, valve 54 is opened, MFC II is used to provide the proper dopant concentration in conjunction with MFC I, valve 56 is closed and valve 55 is opened. Valve 42 is opened with valve 57 closed. Valve 60 can also be closed when no etching is to take place and only dopant gas flow is used. In some cases valve 55 is closed and dopant gas directly from the dopant gas inlet is passed through valve 56 to obtain a high dopant level and avoid the first dilution of hydrogen inlet through the on-off valve 52. The dopant gas is then diluted and flow made constant through addition of hydrogen at line 27′.

In a specific example of carrying out the invention, a conventional low-high-low impatt epitaxial crystal with buffer layer is formed.

In this example, MFC I has a value of 100 SCCM (standard cubic centimeters per minute, full scale values given) MFC II has a value of 5.0 SLPM (standard liter per minute), MFC III has a value of 300 SCCM, MFC IV has a value of 100 SCCM, MFC V has a value of 100 SCCM. VCA and VCB each have a value of 30 milligrams per minute arsenic trichloride or 300 SCCM hydrogen.

The reactor is a 50 millimeter I.D. quartz reactor with quarter inch O.D. quartz inlets at 11 and 17. The temperature at a gallium source 12 is maintained at 815° C. while the temperature at a gallium arsenide seed crystal having a nominal 1.4 square inch surface area for deposit is maintained at 727° C.

A system as shown in FIG. 2 is used.

An epitaxial buffer layer of gallium arsenide is grown on a gallium arsenide seed crystal surface by inactivating the etch portion of the etch dopant subsystem by closing valve 60. The dopant portion of the system is run simultaneously with the transport subsystem.

In the dopant system, valve 41 is opened, valve 60 is closed, valve 42 is opened and valve 57 is closed. Valve 54 is opened, valve 56 is opened, valve 55 is closed, valve 52 is open and valve 50 is opened. A mixture of one hundred parts per million of silane in a hydrogen diluent is added to the dopant gas inlet and passed through MFC I to vent at a flow rate of 10 SCCM and thence to MFC II with a flow rate through MFC II of 2.6 SLPM. The flow through MFC III is 90 SCCM. FLow of hydrogen through MFC IV is 10 SCCM as controlled by the control loop of the etch dopant subsystem to provide a flow rate of 100 SCCM at the reactor dopant input 17. The flow rate of 100 SCCM will remain constant throughout the procedure.

Simultaneously with the dopant flow, the transport subsystem is activated to provide a flow of 250 SCCM at input 11. This flow is derived from vaporizer controller VCB which provides an output in line 26 of 22.2 milligrams of arsenic trichloride per minute. The control loop senses hydrogen passing through valve 24 by taking a signal from the vaporizer controller, and adjusts mass flow controller MFC V to provide a varying amount of hydrogen flow in line 27 necessary to bring the total flow at 17 to 250 SCCM. This flow in line 27 will ordinarily vary from about 25 to 30 SCCM. The bubbler 28 starts with about 250 grams of liquid arsenic trichloride and is temperature regulated in an attempt to maintain its temperature at about 20° C.

The buffer layer builds up to a thickness of about 3 microns in about 25 minutes.

At this point a drift carrier density epitaxial layer is grown by changing the dopant concentration. Valve 55 is now opened and valve 56 closed. This dramatically changes the dopant concentration to lower it since the dopant is being diluted by hydrogen flow through valve 52. The flow through MFC III is maintained at the same value as above but the concentration of dopant gas is now substantially lower since the diluent gas introduced through valve 52 actively lowers the concentration to the desired value. Flow in MFC III is sensed through the control loop of the etch dopant subsystem and flow of hydrogen diluent through line 27' adjusted to provide the constant flow at the value previously given. The settings are maintained for 25 minutes and a second layer is deposited having a thickness of 3 microns.

In a third step the dopant spike which makes the resultant product a low-high-low impatt device is grown by opening valve 56 and closing valve 55 for 3 seconds which form the dopant peak layer.

In a fourth step, valve 56 is again closed and valve 55 opened to provide the same low level of dopant as previously described for a period of 2½ minutes to build up a thin layer approximately 0.25 microns which is the low layer in the low-high-low device. The run is terminated by closing valves 42, 60, 25 and other inlets to the reactor. The seed crystal is taken out through a conventional reactor exit and is found to have excellent electrical properties. It is found that the layer buildup is at a substantially constant rate in the reactor which is believed due to the constant flow and constant concentration conditions in the reactor.

In some cases, the etch system is run just prior to the steps outlined above by opening valve 60, closing valve 41 and 42 with the transport subsystem on, to provide slight etching of the seed crystal prior to deposition.

If one were to repeat the above example replacing arsenic trichloride with phosphorous trichloride and gallium with indium as a source, making suitable changes in the temperature at the source and substrate, epitaxial growth of indium phosphide occurs. Similarly other compounds of this type can be grown as known in the art.

While specific conditions, parameters and parts have been shown and described herein, it should be understood that many variations are possible. As the diameter, configuration or volume of the reactor changes, all of the parameters for good etching, deposition and doping will also change. This is known in the art. A wide range of temperature and flow conditions are possible in a wide range of reactor sizes and seed crystal sizes. The temperature at the source 12 (which may have more than one material) is such as to have the source react and be picked up by the vapor from the transport subsystem with a temperature gradient to the lower temperature of the substrate which promotes deposition of gallium arsenide or other compound. The temperature range at the source and substrate can vary from 550° C. to 850° C. at flow rates of reactants from 100 SCCM to 500 SCCM and even this wide range can be expanded with varying conditions. Layer buildup can be from thicknesses of from tenths of microns to 40 microns or more. Any combination of differently or similarly doped layers can be obtained.

While it is preferred to use a system as shown in FIG. 2 the subsystems need not be interconnected at all. For example, separate hydrogen feeds can be used. A separate control loop and mass flow controller can be attached directly to MFC III so that the etch and doping systems can be completely separated. Use of the transport subsystem alone provides advantages in conventional procedures. Similarly the constant flow of the doping subsystem can alone provide advantages in a reactor having a conventional feed to the transport inlet. The use of constant concentration constant flow obtained from the etch portion of the etch doping subsystem also provides advantages whether or not the other components of the system are used.

I claim:

1. A method of producing an epitaxial layer of a compound comprising a first material selected from the group consisting of boron, aluminum, gallium, indium and mixtures thereof and a second material selected from the group consisting of phosphorus, arsenic, antimony and mixtures thereof, said method comprising, passing a carrier gas flow through a liquid halide of said second material to obtain a first vapor containing a halogen, carrier gas and second material as a raw reactor input vapor, while monitoring said carrier gas flow and adjusting it to obtain a predetermined mass of halogen and second material in said raw vapor, and forming a final reactor input vapor while maintaining a constant flow rate of said final vapor at a constant concentration of second material by monitoring the total volume of carrier gas in said raw vapor as added per unit of time and adjusting said raw vapor by adding a volume of additional carrier gas to form said final vapor, passing said final vapor to a source of said first material in a reactor where a reaction takes place, passing the products of said reaction to a seed crystal and depositing said epitaxial layer on said seed crystal.

2. A method in accordance with claim 1 wherein said carrier gas flow is passed through a vaporizer controller and then bubbled through said liquid halide with the resultant vapor monitored to determine mass of the halide picked up in the flow and said carrier gas flow passing to said bubbler is controlled to keep said last-mentioned mass constant while varying flow of raw vapor and concentration of halide in the resultant raw vapor.

3. A method in accordance with the method of claim 2 wherein the total flow per unit time of carrier gas to said bubbler and carrier gas added to said raw vapor is equal to a predetermined constant.

4. A method in accordance with the method of claim 3 wherein said carrier gas flow added to said raw vapor is passed through a mass flow controller operatively responsive to carrier gas flow to said bubbler.

5. A method in accordance with claim 1 wherein said compound is gallium arsenide.

6. A method in accordance with claim 2 wherein said compound is gallium arsenide.

7. A method in accordance with claim 3 wherein said compound is gallium arsenide.

8. A method in accordance with claim 4 wherein said compound is gallium arsenide.

9. A method in accordance with claim 1 wherein said carrier gas is hydrogen.

10. A method in accordance with claim 2 wherein said carrier gas is hydrogen.

11. A method in accordance with claim 3 wherein said carrier gas is hydrogen.

12. A method in accordance with claim 5 wherein said carrier gas is hydrogen.

13. A method in accordance with claim 1 wherein said compound is indium phosphide.

14. A method in accordance with claim 5 wherein said liquid halide is arsenic trichloride.

15. In method of forming an epitaxial layer of a compound selected from the group consisting essentially of gallium aluminum arsenide, gallium arsenide and indium phosphide by a transport reaction wherein a carrier gas is passed through a liquid halide to form a raw reactor input vapor flow which is passed to a reactor input, the improvement comprising, monitoring the concentration and flow rate of the raw reactor input vapor and adjusting to a predetermined flow rate and concentration by adjustment of an amount of additional carrier gas flow added to said raw reactor input vapor.

16. The improvement of claim 15 wherein said compound is gallium arsenide, and said monitoring is carried out by constantly measuring carrier gas flow to said liquid halide and adjusting the amount of additional carrier gas flow to have a predetermined constant value of carrier gas flow to said reactor.

17. A method of maintaining a constant flow rate in a reactor for producing an epitaxial layer of a compound comprising a first material selected from the group consisting of boron, aluminum, gallium, indium and mixtures thereof and a second material selected from the group consisting of phosphorus, arsenic, antimony and mixtures thereof, wherein a flow of reactor input vapor carrying said second material and a halogen is passed to a reactor at a first reaction zone having a source of said first material and the resultant vapor then passed to a second zone carrying a seed crystal where said epitaxial layer of said compound is formed, said method comprising, introducing a supplementary constant volume vapor flow at a predetermined concentration in said reactor of a third material selected from the group consisting essentially of a diluent gas, dopant and mixtures thereof, and changing said predetermined concentration while maintaining said constant volume flow.

18. A method in accordance with claim 17 and further comprising said third material comprising a diluent gas and dopant mixture, and being formed by mixing to obtain a first concentration of dopant in diluent gas, and adding additional diluent gas in an amount sufficient to maintain said predetermined concentration of dopant, and subsequently changing said last-mentioned concentration to obtain a variation in dopant concentration at a second predetermined concentration.

19. A method of providing a constant flow rate in a reactor for producing an epitaxial layer of a compound comprising a first material selected from the group consisting of boron, aluminum, gallium, indium and mixtures thereof and a second material selected from the group consisting of phosphorus, arsenic, antimony and mixtures thereof, wherein a flow of reactor input vapor carrying said second material and a halogen is passed to a reactor at a first reaction zone having a source of said first material and the resultant vapor then passed to a second zone carrying a seed crystal where said epitaxial layer of said compound is formed, said method comprising, monitoring dopant gas flow rate to said reactor and adding supplementary diluent gas thereto to maintain said dopant gas flow at a predetermined constant value.

20. A method in accordance with the method of claim 19 and further comprising diluting said dopant gas flow to a first value by means of a plural array of mass flow controllers capable of electrical actuation to a variety of predetermined flow conditions and further diluting said dopant gas flow by addition of a minor amount of supplementary diluent gas added to maintain a constant flow rate.

21. A method in accordance with the method of claim 1 and further comprising adding a constant volume flow of diluent gas to said reactor along with said final vapor.

22. A method in accordance with the method of claim 21 and further comprising said diluent gas carrying a dopant.

23. A method in accordance with the method of claim 22 and further comprising varying the concentration of dopant in said diluent gas while maintaining a constant gas flow rate thereof to said reactor.

24. A method in accordance with the method of claim 23 wherein said last-mentioned constant flow rate is obtained by electrically monitoring flow of a dopant diluent gas mixture through an electrically actuated mass flow controller and electrically actuating a second mass flow controller to provide a predetermined flow rate.

25. A method in accordance with claim 24 wherein said compound is gallium arsenide.

26. A method in accordance with claim 19 wherein said compound is gallium arsenide.

27. A method in accordance with claim 18 wherein said compound is gallium arsenide.

28. In a method of producing an epitaxial layer of a compound comprising a first material selected from the group consisting of boron, aluminum, gallium, indium and mixtures thereof and a second material selected from the group consisting of phosphorus, arsenic, antimony and mixtures thereof, the steps comprising passing a carrier gas flow through a liquid halide of said second material to obtain a first vapor containing a halogen, carrier gas and second material as a raw reactor input vapor, while monitoring said carrier gas flow and adjusting it to obtain a predetermined mass of halogen and second material in said raw vapor, and forming a final reactor input vapor while maintaining a constant flow rate of said final vapor at a constant concentration of second material by monitoring the total volume of carrier gas in said raw vapor as added per unit of time and adjusting said raw vapor by adding a volume of additional carrier gas to form said final vapor.

* * * * *

UNITED STATES PATENT AND TRADEMARK OFFICE
CERTIFICATE OF CORRECTION

PATENT NO. : 4,190,470
DATED : February 26, 1980
INVENTOR(S) : Robert E. Walline It is certified that error appears in the above—identified patent and that said Letters Patent is hereby corrected as shown below:

Column 4, line 47, after "hydrogen" insert --through--

Column 6, line 13, after "identical" delete --identical--

Column 8, line 44, change "FLow" to --Flow--

Signed and Sealed this

Sixteenth Day of September 1980

[SEAL]

Attest:

SIDNEY A. DIAMOND

Attesting Officer     Commissioner of Patents and Trademarks